United States Patent
Bar-David (10) Patent No.: US 9,380,537 B2
(45) Date of Patent: *Jun. 28, 2016

(54) METHOD AND APPARATUS FOR MULTIPLE-OUTPUT PARTIAL ENVELOPE TRACKING IN HANDHELD WIRELESS COMPUTING DEVICES

(71) Applicant: Paragon Communications Ltd., Kfar-Saba (IL)

(72) Inventor: Israel Bar-David, Haifa (IL)

(73) Assignee: Paragon Communications Ltd., Kfar-Saba (IL)

( * ) Notice: Subject to any disclaimer, the term of this patent is extended or adjusted under 35 U.S.C. 154(b) by 11 days.

This patent is subject to a terminal disclaimer.

(21) Appl. No.: 14/700,733

(22) Filed: Apr. 30, 2015

(65) Prior Publication Data
US 2015/0319699 A1 Nov. 5, 2015

Related U.S. Application Data

(60) Provisional application No. 61/987,002, filed on May 1, 2014.

(51) Int. Cl.
*H04B 7/212* (2006.01)
*H04W 52/02* (2009.01)
(Continued)

(52) U.S. Cl.
CPC ......... *H04W 52/0261* (2013.01); *H04B 7/0413* (2013.01); *H04W 52/0251* (2013.01); *H04W 52/0296* (2013.01); *H04W 52/267* (2013.01); *H04W 52/52* (2013.01)

(58) Field of Classification Search
CPC .................................................... H04B 7/2123

USPC ......................................................... 370/322
See application file for complete search history.

(56) References Cited

U.S. PATENT DOCUMENTS 8,947,161 B2    2/2015  Khlat et al.
9,099,961 B2 *  8/2015  Kay .................... H03F 1/0244
(Continued)

FOREIGN PATENT DOCUMENTS

WO    2013134026 A2    9/2013

OTHER PUBLICATIONS

Arib STD-T63-36.213 V8.5.0, Evolved Universal Terrestrial Radio Access (E-UTRA); Physical Layer Procedures (Release 8), Industrial Property Rights (IPR), 3GPP Organizational Partners, Valbonne, France, 2008.

(Continued)

*Primary Examiner* — Christopher R Crompton
(74) *Attorney, Agent, or Firm* — M&B IP Analysts, LLC (57) ABSTRACT

A partial envelope tracking (PET) circuitry for improving the dynamic range of a plurality of power amplifiers amplifying radio frequency signals in a MIMO based handheld wireless computing device. The circuitry includes a plurality of sub-PET circuits respectively connected to the plurality of power amplifiers; and a common charging circuit connected to each of the sub-PET circuits and a power source, wherein the common charging circuit comprises a storage capacitor and a logic configured to control the charging of the storage capacitor respective of an operation mode of each of the sub-PET circuits, wherein the operation mode is any one of: a tracking mode and normal mode, wherein during the normal mode of all of the sub-PET circuits the storage capacitor is charged at the voltage level provided by the power source and during the tracking mode of at least one of the sub-PET circuits the storage capacitor is discharged.

23 Claims, 5 Drawing Sheets

(51) Int. Cl.
*H04B 7/04* (2006.01)
*H04W 52/52* (2009.01)
*H04W 52/26* (2009.01)

(56) References Cited

U.S. PATENT DOCUMENTS

| | | |
|---|---|---|
| 2007/0159257 A1 | 7/2007 | Lee et al. |
| 2012/0281597 A1* | 11/2012 | Khlat ................... H03F 3/72 370/277 |
| 2014/0009226 A1 | 1/2014 | Severson et al. |
| 2014/0087671 A1 | 3/2014 | Mostov et al. |
| 2014/0266448 A1 | 9/2014 | Cha et al. |
| 2014/0266456 A1 | 9/2014 | Vice et al. |
| 2014/0306769 A1 | 10/2014 | Khlat et al. |
| 2015/0084701 A1* | 3/2015 | Perreault ................ H03F 3/193 330/297 |
| 2015/0222235 A1* | 8/2015 | Swanson ............... H02M 3/158 381/120 |

OTHER PUBLICATIONS

The International Search Report and The Written Opinion of the International Searching Authority for PCT/US2015/028513, ISA/RU, Moscow, Russia, Date of Mailing Sep. 3, 2015.

* cited by examiner

METHOD AND APPARATUS FOR MULTIPLE-OUTPUT PARTIAL ENVELOPE TRACKING IN HANDHELD WIRELESS COMPUTING DEVICES

CROSS REFERENCE TO RELATED APPLICATIONS

This application claims the benefit of U.S. provisional application No. 61/987,002 filed on May 1, 2014, the contents of which are herein incorporated by reference.

TECHNICAL FIELD

This disclosure relates to the field of power amplifiers, and more particularly to techniques for efficient partial envelope tracking in handheld wireless computing devices.

BACKGROUND

Envelope tracking (ET) is a known technique for improving the efficiency of power amplifiers. In a conventional implementation of an envelope tracking technique, a voltage signal at the drain input of a radio frequency (RF) power amplifier (PA) is varied to be proportional to the envelope of a RF signal. Tracking is performed in order to match the dynamic range of the supply voltage of the power amplifier to the instantaneous requirements of the RF signal envelope.

A subclass of the ET technique is partial envelope tracking (PET). A conventional PET circuit replaces the tracking below a certain envelope voltage level by providing a constant voltage of the power supply to the drain input of the RF PA. A conventional PET circuit also tracks the envelope peaks above that voltage level. One of the advantages of a PET technique is low power consumption and, specifically, low power consumption of a power supply when tracking signals with strongly varying envelopes. Examples for such signals include long-term evolution (LTE) signals, wireless local area network (WLAN) signals, and the like.

Advanced wireless and handled devices designed for LTE and WLAN communications are based on multi-input-multi-output (MIMO) architectures. In such architectures, the information (input) signal is distributed and transmitted via several transmit channels.

Figure 1:
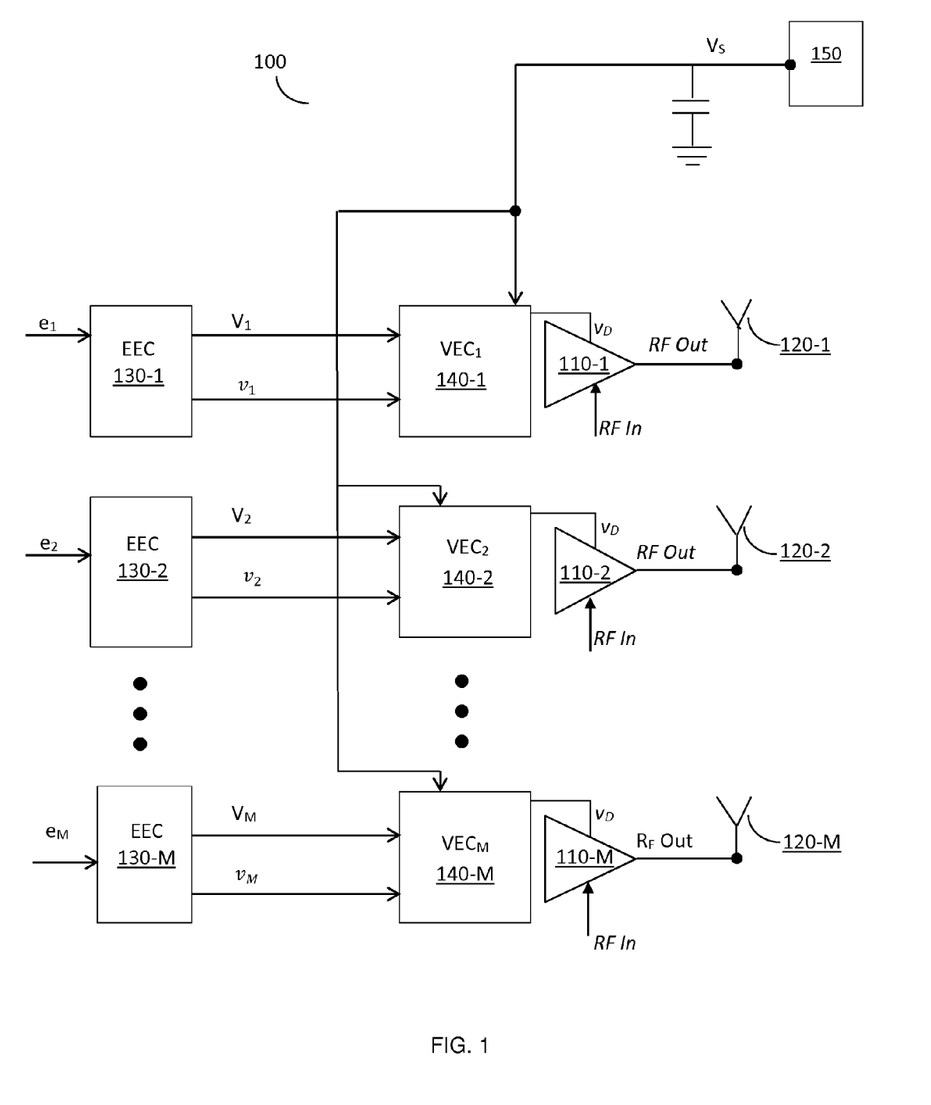
FIG. 1 is a block diagram of a conventional PET circuitry utilized in MIMO-based handheld wireless computing devices.

As illustrated in FIG. 1, each transmit channel includes a power amplifier 110 connected to an antenna 120. The antennas 120-1 through 120-M form the MIMO architecture. In order to allow the partial envelope tracking of transmitted RF signals, each power amplifier 110 is connected to a PET circuitry that includes a voltage enhancement circuitry (VEC) 140 and an excess envelope calculator (EEC) circuit 130. For example, a power amplifier 110-1 is connected to a VEC 140-1 and VEC 140-1 is connected to EEC 130-1.

Generally, each EEC 130, e.g. EEC 130-1, determines the mode of operation of the respective VEC 140, e.g. VEC 140-1, based on an access of the input signal (el). The operation may be either a tracking mode or a normal mode. The tracking mode is active when the envelope of the transmitted signal $e_1$ is above a predefined threshold. In this mode, the voltage signal $V_D$ provided to the power amplifier is continuously adapted according to the changes of the envelope of the transmitted signal in order to match the required dynamic range of the power amplifier. In the normal mode, the voltage signal $V_S$ is provided to the power amplifier from the power source 150.

Figure 2:
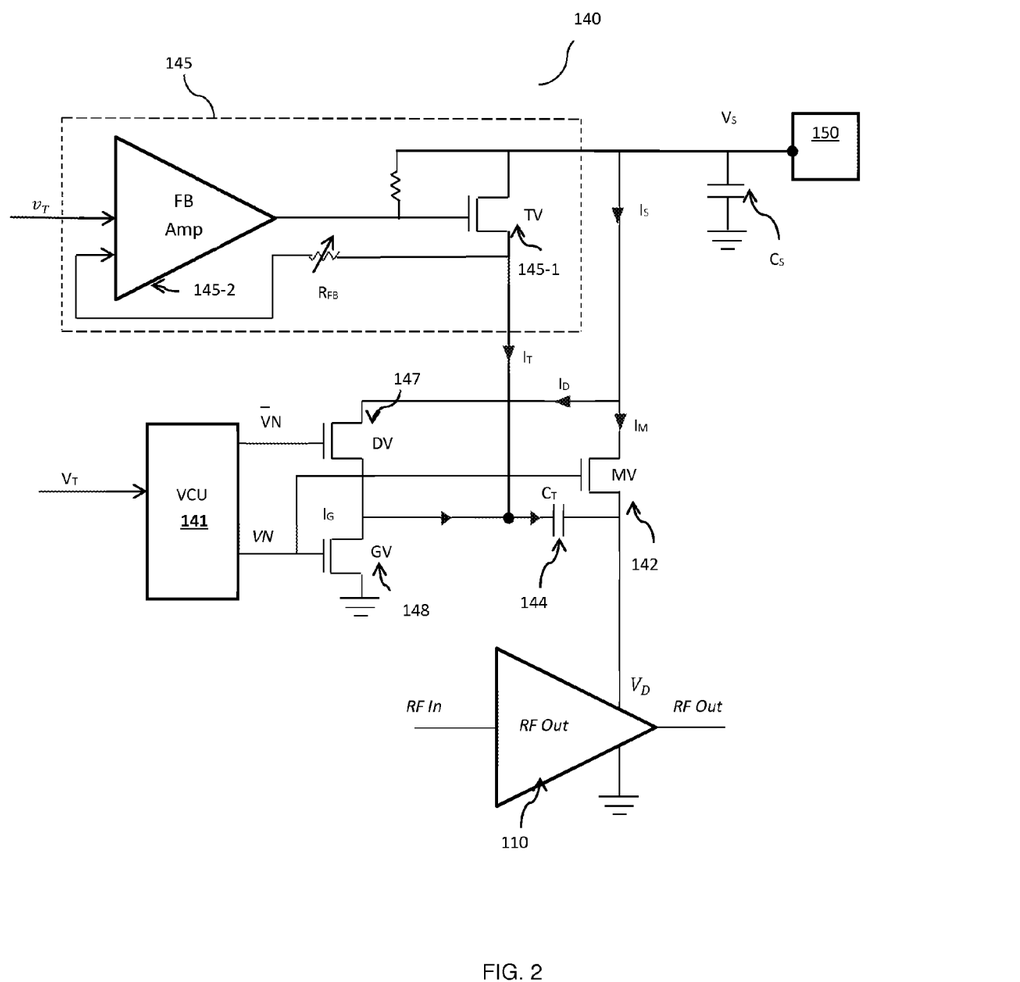
FIG. 2 is a block diagram of a conventional PET circuit.

Referring to FIG. 2 where the operation of the PET circuity including the VEC 140 is shown, it should be noted that the description provided with reference to FIG. 2 is applicable for each VEC 140 shown in FIG. 1. In a conventional implementation, the VEC 140 includes a main valve (MV) 142 connected to the power amplifier (RF AMP) 110 and the power source 150 that outputs a voltage signal ($V_S$) filtered by a capacitor ($C_S$). The VEC 140 further includes an envelope tracking function realized by a tracking unit 145 that includes at least a tracking valve (TV) 145-1 connected to a feedback resistor ($R_{FB}$) and a linear feedback amplifier (FB AMP) 145-2.

The VEC 140 also includes a diversion valve (DV) 147 which is connected in series to a grounding valve (GV) 148. In a conventional implementation, a Voltage Control Unit (VCU) 141 activates normal mode when the envelope 'e' of a transmitted RF signal is below a predefined voltage threshold. The tracking mode is active when the envelope 'e' of the transmitted signal is above the predefined voltage threshold. In this mode, the voltage signal provided to the power amplifier is continuously adapted according to the changes of the envelope of the transmitted signal in order to match the required dynamic range of the power amplifier.

Also connected in the VEC 140 is a storage capacitor $C_T$ 144, which, together with DV 147, allows a smooth transition between the normal and tracking mode. Specifically, during the normal mode, the storage capacitor 144 is charged at the voltage level provided by the power source and during the tracking mode the storage capacitor 144 is discharged. When the VEC 140 switches from the normal mode to the tracking mode, a source of a drain current to the power amplifier 110 switches from the power source 150 to a current path through the DV 147 and the storage capacitor 144. To minimize voltage fluctuations of the drain voltage VD provided to the power amplifier, the capacitance of the storage capacitor $C_T$ 144 is large, typically several microfarads. Therefore, the size of the capacitor in terms of area is also large.

Consequently, whether the storage capacitor is implemented as a discrete component or as part of an integrated circuit (IC), the size of the storage capacitor 144 is relatively big. This problem is magnified when more than one storage capacitor is required in a system that includes more than one transmit channel (e.g., the system shown in FIG. 1). For example, for a MIMO-based system with 4 transmit channels, 4 storage capacitors are required.

As conventional PET circuits are large in size and primarily designed to support power amplifiers that are stand-alone modules, such circuits cannot provide efficient solutions for MIMO-based systems. In particular, such conventional PET circuits cannot be efficiently utilized in handheld wireless devices, for example, smartphones and tablet computers in which the size is a critical constraint.

It would therefore be advantageous to provide a PET solution that would overcome the deficiencies noted above and be efficiently implemented in MIMO-based wireless handheld devices.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all aspects nor delineate the scope of any or all embodiments. Its sole purpose is to present some concepts of one or more embodiments in a simplified form as a prelude to the more detailed description that is presented later. For convenience, the term some embodiments may be used herein to refer to a single embodiment or multiple embodiments of the disclosure.

Certain embodiments disclosed herein include a partial envelope tracking (PET) circuitry for improving the dynamic range of a plurality of power amplifiers amplifying radio frequency (RF) signals in a multi-input-multi-output (MIMO) based handheld wireless computing device. The circuitry comprises a plurality of sub-PET circuits respectively connected to the plurality of power amplifiers; and a common charging circuit connected to each of the plurality of sub-PET circuits and a power source, wherein the common charging circuit comprises a storage capacitor and a logic configured to control the charging of the storage capacitor respective of an operation mode of each of the plurality of sub-PET circuits, wherein the operation mode is any one of: a tracking mode and a normal mode, wherein during the normal mode of all of the plurality of sub-PET circuits the storage capacitor is charged at the voltage level provided by the power source and during the tracking mode of at least one of the plurality of sub-PET circuits the storage capacitor is discharged.

Certain embodiments disclosed herein also include a wireless computing device. The device comprises a radio frequency transmitter including a multi-input-multi-output (MIMO) module including a plurality of power amplifiers connected to a plurality of antennas, wherein the radio frequency transmitter is configured to transmit radio frequency (RF) signals; a partial envelope tracking (PET) circuitry for improving the dynamic range of the plurality of power amplifiers amplifying RF signals, including: a plurality of sub-PET circuits respectively connected to the plurality of power amplifiers; and a common charging circuit connected to each of the plurality of sub-PET circuits and a power source, wherein the common charging circuit comprises a storage capacitor and a logic configured to control the charging of the storage capacitor respective of an operation mode of each of the plurality of sub-PET circuits, wherein the operation mode is any one of: a tracking mode and a normal mode, wherein during the normal mode of all of the plurality of sub-PET circuits the storage capacitor is charged at the voltage level provided by the power source and during the tracking mode of at least one of the plurality of sub-PET circuits the storage capacitor is discharged.

Certain embodiments disclosed herein also include a method for improving the dynamic range of a plurality of power amplifiers amplifying radio frequency (RF) signals in a multi-input-multi-output (MIMO) based wireless computing device. The method comprises providing a plurality of sub-PET circuits respectively connected to the plurality of power amplifiers; and providing a common charging circuit connected to each of the plurality of sub-PET circuits and a power source, wherein the common charging circuit comprises a single storage capacitor and a logic; monitoring a plurality of binary envelope tracking parameters to determine an operation mode of the common charging circuit, wherein the operation mode is any one of: a tracking mode and a normal mode; and controlling the charging of the single storage capacitor respective of the determined operation mode, wherein during the normal mode the storage capacitor is charged at the voltage level provided by the power source and during the tracking mode the storage capacitor is discharged.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

It is important to note that the embodiments disclosed herein are only examples of the many advantageous uses of the innovative techniques herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Figure 3:
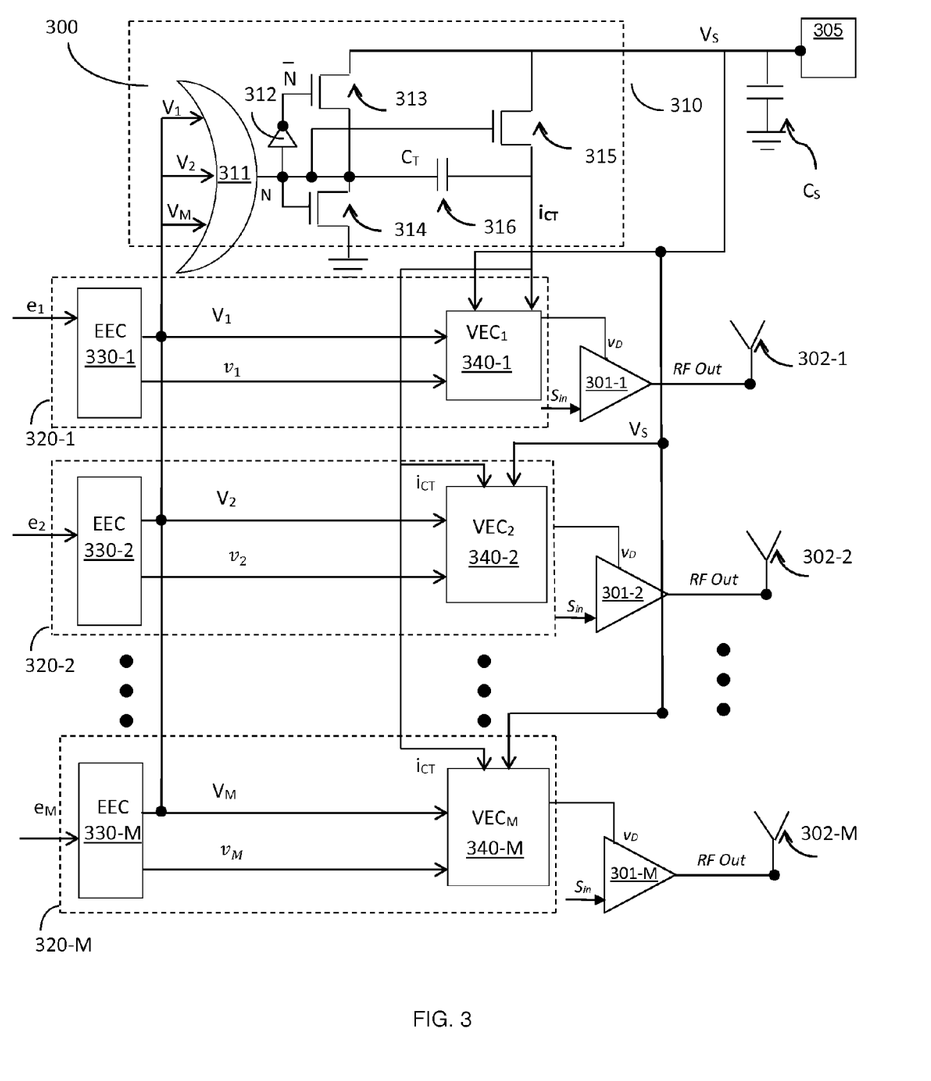
FIG. 3 is a block diagram of PET circuitry utilized in MIMO-based handheld wireless computing devices according to one embodiment.

FIG. 3 is an exemplary and non-limiting block diagram of a partial envelope tracking (PET) circuitry 300 utilized in MIMO-based systems according to one embodiment. The PET circuitry 300 can be integrated in any handheld wireless computing device including, but not limited to, a smartphone, a tablet computer, a laptop computer, a notebook computer, a wearable computing device, and the like. Such a handheld wireless computing device receives and transmits radio frequency (RF) modulated signals, for example, by means of a RF receiver/transmitter. Such signals can be, but are not limited to, single carrier modulated signals, multi-carrier modulated signals, signals from the Orthogonal Frequency-Division Multiplexing (OFDM) or Orthogonal Frequency Division Multiple-Access (OFDMA) families, and the like. The PET circuit 300 can process signals of wireless communication protocols including, but not limited to, 3G, LTE, LTE Advanced, IEEE 802.11 ac, IEEE 802.11 ax, and so on.

According to the disclosed embodiment, the PET circuitry 300 provides an efficient PET solution for MIMO-based systems as only one storage capacitor is utilized to provide supplemental drain current to each of the M transmit channels when required. That is, instead of implementing a PET circuit with M storage capacitors (M>1), the PET circuitry 300 includes only a single storage capacitor.

Additionally, as will be discussed in detail below, the design and the topology of the various components in the PET circuitry 300 enables smooth transitions between normal and tracking modes in each of the M transmission paths. Smooth transitions are of high importance for ensuring and maintaining spectral purity in wireless communication systems that transmit and receive signals with very high bandwidth for information transmission. In an exemplary embodiment, a "very high bandwidth" is higher than 50 Mbps.

To this end, the PET circuitry 300 includes a common charging circuit 310 and a number of M of sub-PET circuits 320-1 through 320-M (M is an integer greater than 1). In an embodiment, each sub-PET circuit 320-i (i=1, . . . , M) is connected to a different and independent transmit channel, that is, to a different power amplifier 301 and a corresponding antenna 302. As will be discussed below, none of the sub-PET circuits 320-1 through 320-M includes a storage capacitor as this function/element is implemented by the common storage capacitor 316 in the common charging circuit 310. A power source 305 feeds the power amplifiers 301-1 through 301-M in the normal mode of operation of each of the sub-PET circuits.

Specifically, according to an embodiment, the common charging circuit 310 includes logic OR and NOT gates 311 and 312, respectively, three valves 313, 314, 315, and a storage capacitor 316. The power source 305 is coupled to the valves 313 and 315. The storage capacitor 316 is also connected to each sub-PET circuit 320-i (i=1, . . . , M). In practice, the storage capacitor 316 is connected to a Diversion valve (DV) of each VEC (see FIG. 4). In one implementation, the valves are field-effect transistors (FETs).

Each sub-PET circuit 320-i (i=1, . . . , M) includes an EEC 321-i and a VEC 322-i (i=1, . . . , M). An EEC 321-i determines the mode of operation of the respective VEC 322-i based on an excess of the input signal ($e_i$). The operation may be either a tracking mode or a normal mode. The tracking mode of a sub-PET circuit 320-i is active when the envelope of the corresponding transmitted signal i, is above a predefined threshold (hereinafter the Current Diversion threshold or "CD-threshold"). In this mode, the voltage signal provided to power amplifier 301-i is continuously adapted according to the changes of the envelope of the transmitted signal, in order to match the required dynamic range of power amplifier 301-i. In the normal mode, the voltage signal $V_S$ is provided to power amplifier 301-i (i=1, . . . , M) from the power source 305. As shown in FIG. 3, each VEC 340-i is connected to the power source 305.

An EEC 330-i outputs envelope tracking parameters $v_i$ and $V_i$ (i=1, . . . , M). In an embodiment, the parameter $v_i$ is an analog voltage equal to the excess of the signal envelope ($e_i$) over the CD-threshold. That is, the parameter $v_i$ is determined as follows:

$v_i = e_i -$ CD-threshold; when $e_i \geq$ CD-threshold
$v_i = 0$; when $e_i <$ CD-threshold The tracking control parameter $V_i$ is a binary value determined as follows:

$V_i =$ "0" when $v_i = 0$; and
$V_i =$ "1" when $v_i > 0$

The CD-threshold is a voltage level at which the current diversion operation is activated, when the envelope of the signal is crossing this threshold level. The CD-threshold can be either fixed during a transmission session, or may vary during a transmission session according to the average power level of the transmitted signal during the session. Also, the CD-threshold for each of the sub-PET circuits 320-i (i=1, . . . , M) can be set to a different value.

The tracking mode of the common charging circuit 310 is active when at least one $V_i$ parameter equals to "1". That is, when an envelope of one or more of the transmitted signals 1, 2, . . . , M is above its CD-threshold. The normal mode is active when all of the $V_i$ parameters equal to "0". The $V_i$ (i=1, . . . , M) are used to generate the control signals N and $\overline{N}$ of the common charging circuit 310. Specifically, the control signals N and $\overline{N}$ are utilized to control the operation of the valves 313, 314, and 315.

In a preferred embodiment, the control signals N and $\overline{N}$ are set to binary values respective of the mode of operation of each VEC 340-i. The control signal N equals to '0' if and only if each VEC 340-i (i=1, 2, . . . , M) operates in the normal mode. The control signal N equals to '1' if at least one VEC 340-i (i=1, 2 . . . , M) operates in the tracking mode. The tracking and normal mode of each VEC 340-i are determined respective of the $V_i$ parameters as discussed above. The control signal $\overline{N}$ is the opposite of the N signal. Thus, the control signal $\overline{N}$ equals to 0 if at least one of the VEC 340-i is in the tracking mode and N=1 if all of the VECs 340-i are in the normal mode.

Each VEC 340-i (i=1, 2, . . . , M) includes a main supply path having a main valve (MV) connecting the respective power amplifier 301-i to the power source 305. The VEC 340-i further includes a supplementary supply path including a diversion valve (DV) and a tracking valve (TV) connected, in parallel, between the power source and a power amplifier 301-i. The structure and operation of a VEC 340-i are discussed in greater detail with reference to FIG. 4.

At one end, the storage capacitor 316 is connected to the DV (not shown in FIG. 3) of each of the VEC 340-i while at the other end is connected to the valve 314. The storage capacitor CT 316 discharges during the tracking mode (i.e., when N=1) of one or more of the VEC 340-i and recharges during the normal mode periods.

Specifically, during a normal mode of the common charging circuit 310, the control signal N equals 0 (N=0). As a result, the valves 314 and 315 are fully conducting and valve 313 is blocked. This would cause charging the storage capacitor 316 to a voltage level of $V_S$ provided by the power source 305. During the tracking mode, the values of N and $\overline{N}$ are switched, that is, N=1 and $\overline{N}$=0. As such the valves 314 and 315 are blocked and the valve 313 fully conducts. This would cause discharging the storage capacitor 316 through the DV of each VEC 340-i (i=1, . . . , M) operating in a tracking mode at that time.

Specifically, in such a case of a VEC 340-i operating in the tracking mode, a series connection of the power supply 305 with the storage capacitor $C_T$ 316 and the valve DV of a VEC 340-i is formed. As a result, the effective voltage supplied to a respective power amplifier 301-i during tracking mode is up to 2 times $V_S$ less the voltage level drops on the valve DV-i of a VEC 340-i. When the valve DV-i conducts (i.e., VEC 340-I is in tracking mode), the valve DV supplies current $I_D$ that is approximately equal to the nominal current $I_S$. The current $I_S$ is supplied by the power source 305 through the respective MV-i valve of a VEC 340-i in normal mode. At the end of the tracking mode, i.e., when N switches to 0 again, the storage capacitor 316 is recharged to the voltage level $V_S$ via the valve 313.

Therefore, it should be appreciated that when switching to tracking mode, a valve DV-i of a VEC 340-i (i=1, . . . , M) immediately supplies current $I_D$ that is approximately equal to the nominal current $I_S$ supplied by the power source 305 through the respective MV-i valve in normal mode, thus a smooth switching between the two modes is achieved. This is crucial in communication systems comprising high bandwidth signals, where the frequency of the switching between modes is high, in order to maintain spectral purity of the transmitted signal.

In an embodiment, the capacitance of the storage capacitor 316 is determined as a function of the number (M) of transmit channels. In one embodiment, the capacitance of the storage capacitor 316 is M times the capacitance of a storage capacitor required in a PET circuit of a system with only one transmit channel (i.e. M=1). In this case, the storage capacitor 316 is capable of handling M simultaneous tracking events (one in each transmission path), as to enable supply of enough current to each of the M sub-PET circuits.

In another embodiment, the capacitance of the storage capacitor 316 is a function of both M, as well as the average number of simultaneous tracking events. For example, if on the average, there are L (L<M) simultaneous tracking events per unit time (i.e., L out of the M transmission paths are in tracking mode simultaneously), the capacitance of the storage capacitor 316 is L times the capacitance of a storage capacitor required in a PET circuit of a system with only one transmission path (i.e. M=1).

In an embodiment, the functionality of the PET circuity 300 can be implemented in an integrated circuit (IC) of a RF module of a wireless and/or handheld computing device. The other components are passive electrical components that are relatively small in size, easy to implement, and inexpensive. Thus, the disclosed PET circuity 300 can be advantageously implemented in handheld wireless devices.

Figure 4:
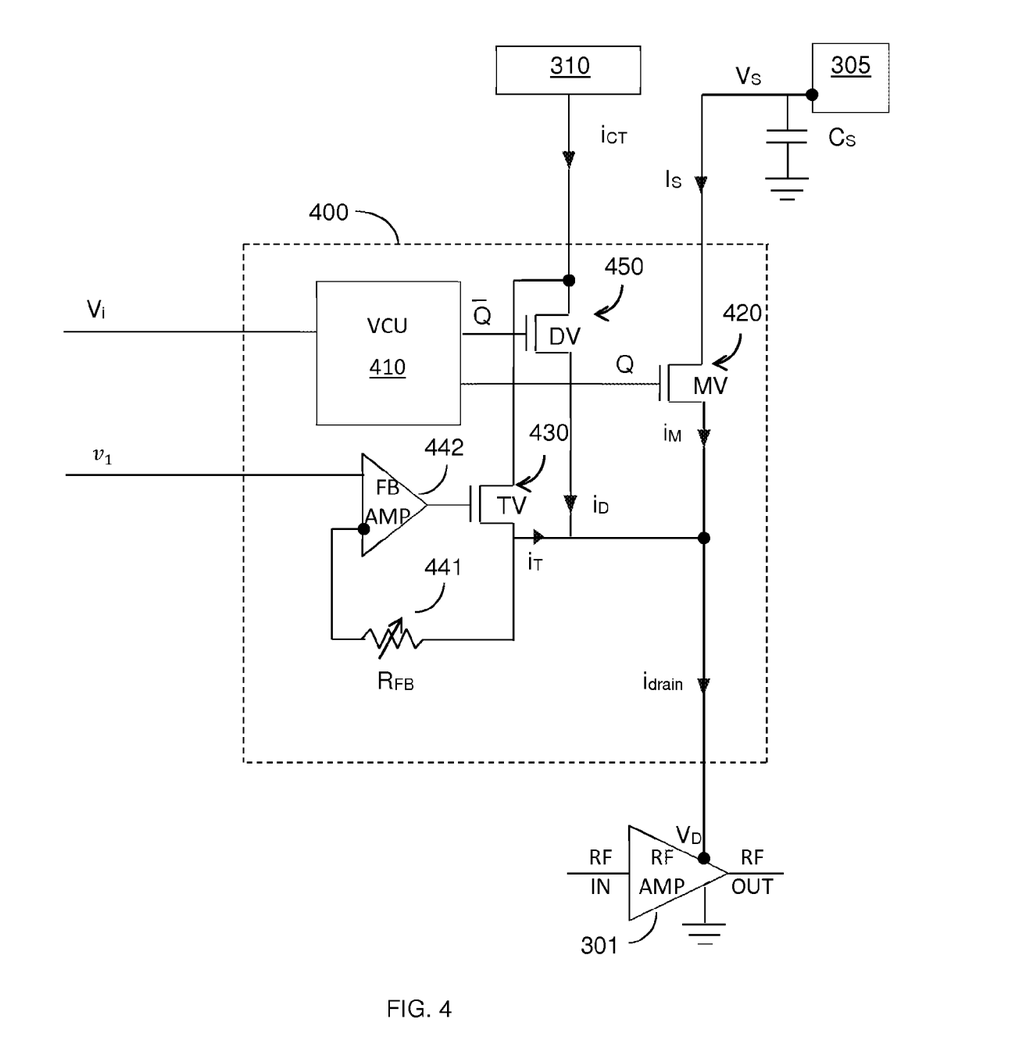
FIG. 4 is a block diagram of a VEC utilized in MIMO-based handheld wireless computing devices according to one embodiment

FIG. 4 shows an exemplary and non-limiting block diagram of a VEC 400 implemented according to one embodiment. The VEC 400 may be any of the VEC's 340-i discussed with reference to FIG. 3. The VEC 400 is dynamically designed to match the dynamic range of the supply voltage of a power amplifier 301 to the instantaneous requirements of the RF signal envelope.

The VEC 400 includes a valves control unit (VCU) 410, a main valve (MV) 420 connected to a power amplifier (RF AMP) 301, and a power source 305 that outputs a voltage signal ($V_S$) filtered by a capacitor ($C_S$). It should be noted that the power source 305 is typically the power source of the device in which the PET circuity 300 operates. The envelope tracking function is realized by a tracking unit that includes at least a tracking valve (TV) 430 connected to a feedback resistor ($R_{FB}$) 441 and a linear feedback amplifier (FB AMP) 442. In an embodiment, the power amplifier 301 is implemented in an RF module of the wireless handheld device.

The VEC 400 also includes a diversion valve (DV) 450 which is connected to the common charging circuit 310. The operation of the MV 420 and the DV 450 is controlled by the VCU 410. In one implementation, the MV 420 and the DV 450 are field-effect transistors (FETs).

In an embodiment, the VCU 410 operates in two different modes: normal and tracking. As described in detail above, the normal mode is active when the envelope of a transmitted RF signal is below the CD-threshold and the tracking mode is active when the envelope of a transmitted RF signal is above the CD-threshold. Specifically, the VCU 410 outputs two control signals Q and $\overline{Q}$ respective of the tracking parameter $V_i$. As illustrated in FIG. 4, the tracking parameter $V_i$ is input to the VCU 410, which activates one of the modes respective thereof. The control signals Q and $\overline{Q}$ determine the states of the MV 420 and the DV 450 during the normal and tracking modes.

Specifically, in the normal mode of operation, the $V_i$ parameter equals "0" and the Q signal is 'on' (e.g., Q is set to a logic value "1", a high voltage level, and so on) and $\overline{Q}$ is 'off' (e.g., $\overline{Q}$ is set to a logic value of "0", a low voltage level, and so on). As a result, the MV 420 fully conducts and the DV 450 is blocked during the normal mode of operation. In addition, as the voltage level of the analog envelope tracking parameter $v_i$ (input to FB AMP 422) is 0 during a normal mode, the TV 430 is also blocked. Therefore, in the normal mode of operation, the power amplifier 301 is driven by the current $i_M$ and the drain voltage $v_D$ is equal to the supply voltage $V_S$ provided by the power source 305.

In the tracking mode of operation, the binary envelope tracking parameter $V_i$ equals "1", and the control voltages for Q and $\overline{Q}$ are 'off' and 'on,' respectively. As a result, the MV 420 is blocked and the DV 450 conducts during the tracking mode of operation. As a result, the current $I_{CT}$ provided by the storage capacitor (316, FIG. 3) flows through the DV 450.

In an embodiment, the DV 450 is biased such that, when the DV 450 conducts, the DV 450 supplies current $i_D$ that is approximately equal to a nominal current $I_S$. The nominal current $I_S$ is supplied by the power source 305 through the MV 420 to the drain input of power amplifier 301. The nominal current $I_S$ is required by the power amplifier 301 immediately before the transition to the tracking mode occurs. In the normal mode of operation, a drain voltage ($V_D$) of the power amplifier 301 equals the voltage signal ($V_S$) supplied by the power source 305.

The design of the VEC 400 ensures that when the control signal Q is "off", the MV 420 is blocked and its output $i_M$ is 0 ($i_M$=0). When switching to the tracking mode, the DV 440 replaces the MV 420 in supplying the nominal current $I_S$ required for the optimal operation of the RF amplifier 301. Specifically, during the tracking mode the current $I_{drain}$ supplied to the RF amplifier 301 is the sum of the current ($i_D$) provided by DV 450 and the tracking current ($i_T$) provided by the TV 430. That is, $I_{drain}=i_D+i_T$.

As noted above, the drain current $i_{drain}$ is the sum of $i_D+i_T$. The tracking current $i_T$ is proportional to the analog envelope tracking parameter $v_i$. Thus, the current $i_{drain}$ increases $v_D$ to be proportional to any excess of the analog envelope tracking parameter $V_i$. When turning back to the normal mode, $v_i=0$ and $V_i=1$, the tracking capacitor $C_T$ 316 is recharged back to $V_S$ and is ready for the next tracking session when required.

It should be appreciated that during the normal mode and at the moment of transition from one mode to another, the drain voltage $v_D$ equals to $V_S$ supplied by the power source 305.

Figure 5:
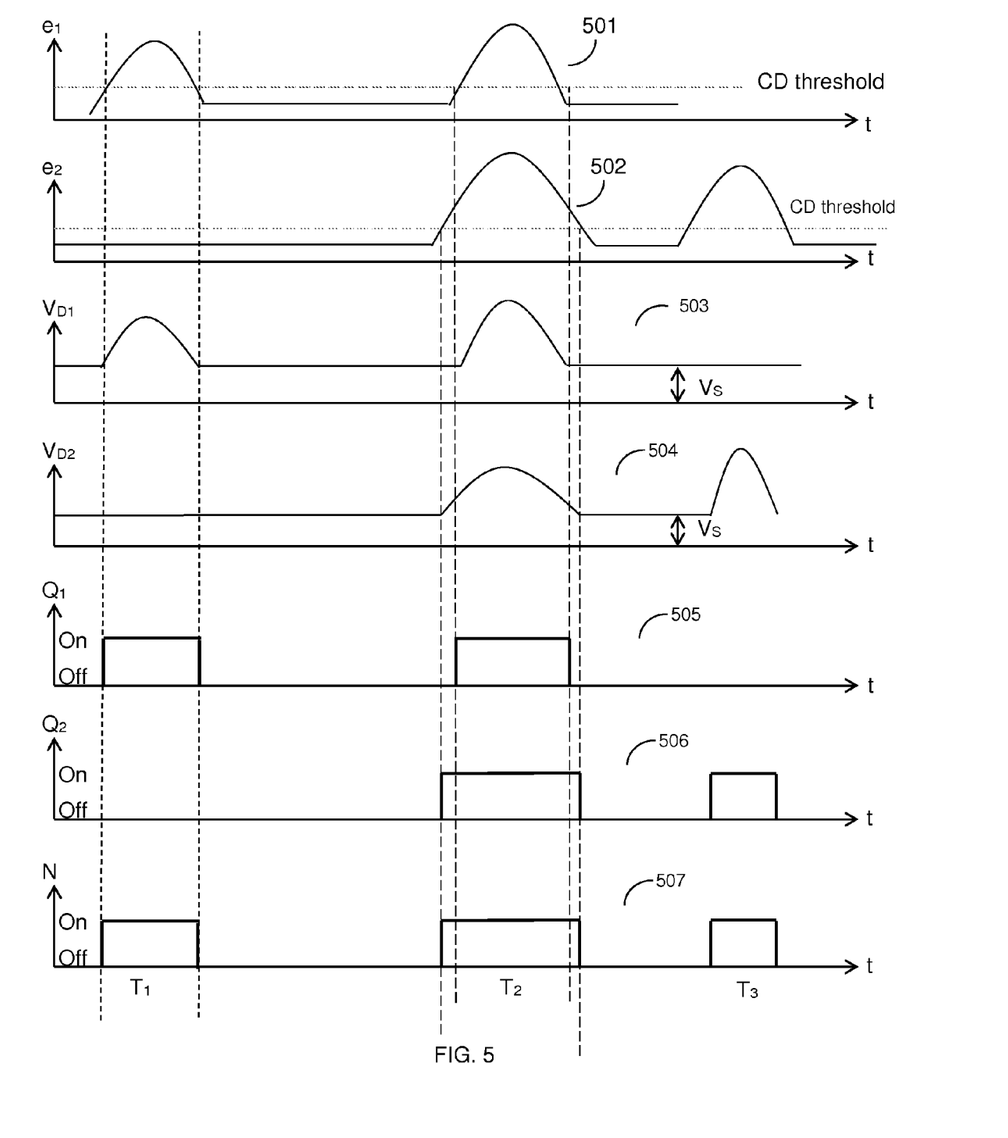
FIG. 5 shows various waveforms demonstrating the operation of the disclosed PET circuitry.

FIG. 5 illustrates the various signals illustrating the operation of the PET circuit 300 with only two transmit channels (M=2). Graphs 501 and 502 are an example of an instantaneous envelopes 'e' and '$e_2$' of two transmitted signals with respect to the CD-threshold. The graphs 503 and 504 illustrate the drain voltage signals $v_{D1}$ and $v_{D2}$, respectively. The voltages $v_{D1}$ and $v_{D2}$ are the drain voltages of the power amplifiers connected in each transmit channel (e.g., PA 301-1 and 301-2, FIG. 3). The graphs 505 and 506 show transition between the normal mode and the tracking mode of two different VEC's (e.g., VEC 340-1 and 340-2) while the graph 507 shows the control signal N of the common charging circuit 310.

In this example, during a time period $T_1$, when the envelope $e_1$ (501) is above the CD-threshold, then the envelope $e_2$ (502) is below the CD-threshold. As such, one VEC, tracking the signal $e_1$, is in a tracking mode ($Q_1$=1) and the second VEC, tracking the signal $e_2$, is in a normal mode ($Q_2$=0). Therefore, the control signal N is also in a tracking node (N=1). As illustrated in graph 503, the drain voltage $V_{D1}$ is propositional to the excess of the envelope signal '$e_1$'. When the envelope signal $e_1$ of the transmitted signal falls again below the CD-threshold, $V_{D1}$ is set to its respective value as of immediately prior to switching to tracking mode, i.e., $V_{D1}$ equals to $V_S$.

During a time period $T_2$, both VECs are in their tracking mode as the respective envelope signals $e_1$ and $e_2$ are over the CD-threshold. In this case, $Q_1$=1 and $Q_2$=1. As shown in FIG. 5, each drain voltage $V_{D1}$ and $V_{D2}$ is proportional to its respective envelope signals $e_1$ and $e_2$. During a time period $T_3$, only the second VEC is in its tracking mode ($Q_1$=0 and $Q_2$=1). Therefore, only $V_{D2}$ is proportional to its respective $e_2$ while $V_{D1}$ is set to $V_S$.

The various embodiments disclosed herein can be implemented as hardware, firmware, software or any combination thereof. Moreover, the software is preferably implemented as an application program tangibly embodied on a program storage unit, a non-transitory computer readable medium, or a non-transitory machine-readable storage medium that can be in a form of a digital circuit, an analog circuit, a magnetic medium, or combination thereof. The application program may be uploaded to, and executed by, a machine comprising any suitable architecture. Preferably, the machine is implemented on a computer platform having hardware such as one or more central processing units ("CPUs"), a memory, and input/output interfaces. The computer platform may also include an operating system and microinstruction code. The various processes and functions described herein may be either part of the microinstruction code or part of the application program, or any combination thereof, which may be executed by a CPU, whether or not such computer or processor is explicitly shown. In addition, various other peripheral units may be connected to the computer platform such as an additional data storage unit and a printing unit. Furthermore, a non-transitory computer readable medium is any computer readable medium except for a transitory propagating signal.

While the disclosed embodiments been described at some length and with some particularity with respect to the several described embodiments, it is not intended that it should be limited to any such particulars or embodiments or any particular embodiment, but it is to be construed with references to the appended claims so as to provide the broadest possible interpretation of such claims in view of the prior art and, therefore, to effectively encompass the intended scope of the disclosure. Furthermore, the foregoing describes the disclosure in terms of embodiments foreseen by the inventor for which an enabling description was available, notwithstanding that insubstantial modifications of the disclosed embodiments, not presently foreseen, may nonetheless represent equivalents thereto.

What is claimed is:

1. A partial envelope tracking (PET) circuitry for improving the dynamic range of a plurality of power amplifiers amplifying radio frequency (RF) signals in a multi-input-multi-output (MIMO) based handheld wireless computing device, comprising:
    a plurality of sub-PET circuits respectively connected to the plurality of power amplifiers; and
    a common charging circuit connected to each of the plurality of sub-PET circuits and a power source, wherein the common charging circuit comprises a storage capacitor and a logic configured to control the charging of the storage capacitor respective of an operation mode of each of the plurality of sub-PET circuits, wherein the operation mode is any one of: a tracking mode and a normal mode, wherein during the normal mode of all of the plurality of sub-PET circuits the storage capacitor is charged at the voltage level provided by the power source and during the tracking mode of at least one of the plurality of sub-PET circuits the storage capacitor is discharged, wherein the logic of the common charging circuit includes: a OR gate, a NOT gate, a first valve, a second valve, and a third valve, wherein the OR gate and the NOT gate are configured to generate control signals controlling the operation of the first valve, the second valve, and the third valve.

2. The PET circuity of claim 1, wherein the first valve, the second valve, and the third valve control the charging and discharging of the storage capacitor based on the control signals.

3. The PET circuity of claim 1, wherein the control signals are generated respective of a plurality of binary envelope tracking parameters, wherein each of the binary envelope tracking parameters is a function of an envelope of the RF signal to be amplified by a respective power amplifier and a predefined threshold.

4. The PET circuity of claim 1, wherein the RF signal is a high bandwidth signal of at least 50 Mbps.

5. The PET circuity of claim 3, wherein the common charging circuit operates in the normal mode when all the binary envelope tracking parameters indicate an envelope that is below the predefined threshold, and wherein the circuit operates in the tracking mode when at least one of the binary envelope tracking parameters indicate an envelope being greater than or equal to the predefined threshold.

6. The PET circuity of claim 1, wherein each of the plurality of sub-PET circuits comprise:
    an excess envelope calculator (EEC) circuit configured to generate an analog envelope tracking parameter and a binary envelope tracking parameter; and
    a voltage enhancement circuitry (VEC) configured to provide an optimal drain current to a respective power amplifier connected thereto.

7. The PET circuity of claim 6, wherein the VEC consists of:
    a main supply path having a main valve (MV) connecting the power amplifier to the power source;
    a supplementary supply path including a diversion valve (DV) and a tracking valve (TV); and
    a valves control unit (VCU) configured to monitor a respective binary envelope tracking parameter to determine a state of each of the main valve, the diversion valve, and the tracking valve during of an operation mode of the VEC.

8. The PET circuity of claim 7, wherein during the normal mode of the VEC the drain current is provided by the power source and during the tracking mode of the VEC the drain current is provided by the storage capacitor through the diversion valve and the tracking valve.

9. The PET circuity of claim 8, wherein during the immediate transition from the normal mode of the VEC, the source of the drain current of the power amplifier is the storage capacitor and the current through the diversion valve, thereby enabling smooth transitions between the normal mode and the tracking mode.

10. The PET circuity of claim 7, wherein the current flow through the tracking valve is proportional to changes in the envelope.

11. A wireless computing device, comprising:
    a radio frequency transmitter including a multi-input-multi-output (MIMO) module including a plurality of power amplifiers connected to a plurality of antennas, wherein the radio frequency transmitter is configured to transmit radio frequency (RF) signals;
    a partial envelope tracking (PET) circuity for improving the dynamic range of the plurality of power amplifiers amplifying RF signals, including:
        a plurality of sub-PET circuits respectively connected to the plurality of power amplifiers; and
        a common charging circuit connected to each of the plurality of sub-PET circuits and a power source, wherein the common charging circuit comprises a storage capacitor and a logic configured to control the charging of the storage capacitor respective of an operation mode of each of the plurality of sub-PET circuits, wherein the logic of the common charging circuit includes: a OR gate, a NOT gate, a first valve, a second valve, and a third valve, wherein the OR gate and the NOT gate are configured to generate control signals controlling the operation of the first valve, the second valve, and the third valve, wherein the operation mode is any one of: a tracking mode and a normal mode, wherein during the normal mode of all of the plurality of sub-PET circuits the storage capacitor is charged at the voltage level provided by the power source and during the tracking mode of at least one of the plurality of sub-PET circuits the storage capacitor is discharged.

12. The wireless computing device 11, wherein the first valve, the second valve, and the third valve control the charging and discharging of the storage capacitor based on the control signals.

13. The wireless computing device 11, wherein the control signals are generated respective of a plurality of binary envelope tracking parameters, wherein each of the binary envelope tracking parameters is a function of an envelope of a RF signal to be amplified by a respective power amplifier and a predefined threshold.

14. The wireless computing device 13, wherein the common charging circuit operates in the normal mode when all the binary envelope tracking parameters indicate an envelope that is below the predefined threshold, and wherein the circuit operates in the tracking mode when at least one of the binary envelope tracking parameters indicate an envelope being greater than or equal to the predefined threshold.

15. The wireless computing device of claim 11, wherein each of the plurality of sub-PET circuits comprise:
   an excess envelope calculator (EEC) circuit configured to generate an analog envelope tracking parameter and a binary envelope tracking parameter; and
   a voltage enhancement circuitry (VEC) configured to provide an optimal drain current to a respective power amplifier connected thereto.

16. The wireless computing device 15, wherein the VEC consists of:
   a main supply path having a main valve (MV) connecting the power amplifier to the power source;
   a supplementary supply path including a diversion valve (DV) and a tracking valve (TV); and
   a valves control unit (VCU) configured to monitor a respective binary envelope tracking parameter to determine a state of each of the main valve, the diversion valve, and tracking valve during of an operation mode of the VEC.

17. The wireless computing device of claim 16, wherein during the normal mode of the VEC the drain current is provided by the power source and during the tracking mode of the VEC the drain current is provided by the storage capacitor through the diversion valve and the tracking valve.

18. The wireless computing device of claim 16, wherein during the immediate transition from the normal mode of the VEC, the source of the drain current of the power amplifier is the storage capacitor and the current through the diversion valve, thereby enabling smooth transitions between the normal mode and the tracking mode.

19. The wireless computing device of claim 16, wherein the current flow through the tracking valve is proportional to changes in the envelope.

20. The wireless computing device of claim 11, wherein the RF signal is a high bandwidth signal having a transmission rate of at least 50 Mbps.

21. A method for improving the dynamic range of a plurality of power amplifiers amplifying radio frequency (RF) signals in a multi-input-multi-output (MIMO) based wireless computing device, comprising:
   providing a plurality of sub-PET circuits respectively connected to the plurality of power amplifiers; providing a common charging circuit connected to each of the plurality of sub-PET circuits and a power source, wherein the common charging circuit comprises a single storage capacitor and a logic, wherein the logic of the common charging circuit includes a OR gate, a NOT gate, a first valve, a second valve, and a third valve;
   controlling the OR gate and the NOT gate to generate control signals to control the operation of the first valve, the second valve, and the third valve;
   monitoring a plurality of binary envelope tracking parameters to determine an operation mode of the common charging circuit, wherein the operation mode is any one of: a tracking mode and a normal mode; and
   controlling the charging of the single storage capacitor respective of the determined operation mode, wherein during the normal mode the storage capacitor is charged at the voltage level provided by the power source and during the tracking mode the storage capacitor is discharged.

22. The method of claim 21, wherein the operation mode is determined to be the normal mode when all the binary envelope tracking parameters indicate an envelope that is below a predefined threshold, and wherein the operation mode is determined to be in the tracking mode when at least one of the binary envelope tracking parameters indicate an envelope being greater than or equal to the predefined threshold, wherein each of the binary envelope tracking parameters is a function of an envelope of the RF signal to be amplified by a respective power amplifier and a predefined threshold.

23. The method of claim 21, the method further comprising:
   providing a main supply path having a main valve (MV) connecting the power amplifier to the power source;
   providing a supplementary supply path including a diversion valve (DV) and a tracking valve (TV); and
   providing a valves control unit (VCU) configured to monitor a respective binary envelope tracking parameter to determine a state of each of the main valve, the diversion valve, and tracking valve, wherein during the normal mode a drain current of the power amplifier is provided by the power source and during the tracking mode the drain current is provided by the storage capacitor through the diversion valve and the tracking valve.

* * * * *